(12) United States Patent
Achouche et al.

(10) Patent No.: US 8,995,804 B2
(45) Date of Patent: Mar. 31, 2015

(54) MONOLITHIC INTEGRATED STRUCTURE COMPRISING A BURIED HETEROSTRUCTURE SEMICONDUCTOR OPTICAL AMPLIFIER AND A PHOTODETECTOR

(75) Inventors: Mohand Achouche, Marcoussis (FR); Christophe Caillaud, Marcoussis (FR); Genevieve Glastre Lemaitre, Marcoussis (FR); François Lelarge, Marcoussis (FR); Romain Brenot, Marcoussis (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/824,726

(22) PCT Filed: Sep. 27, 2011

(86) PCT No.: PCT/EP2011/066766
§ 371 (c)(1),
(2), (4) Date: Jul. 31, 2013

(87) PCT Pub. No.: WO2012/041850
PCT Pub. Date: Apr. 5, 2012

(65) Prior Publication Data
US 2013/0301985 A1 Nov. 14, 2013

(30) Foreign Application Priority Data
Sep. 30, 2010 (EP) .................................. 10306064

(51) Int. Cl.
*G02B 6/26* (2006.01)
*G02B 6/12* (2006.01)
(Continued)

(52) U.S. Cl.
CPC .............. *G02B 6/26* (2013.01); *G02B 6/12002* (2013.01); *G02B 6/12004* (2013.01);
(Continued)

(58) Field of Classification Search
CPC ........ H01S 5/1032; H01S 5/2275; H01S 5/50
USPC ......... 385/14, 37, 28–29, 42, 50, 43, 131, 30, 385/39; 372/50
See application file for complete search history.

(56) References Cited

U.S. PATENT DOCUMENTS 5,134,671 A 7/1992 Koren et al.
6,330,378 B1 * 12/2001 Forrest et al. ................... 385/14
(Continued)

FOREIGN PATENT DOCUMENTS

EP 0469793 A2 2/1992
JP H04-254380 A 9/1992
(Continued)

OTHER PUBLICATIONS

J.W. Raring et al., "40 Gbit/s photonic receivers integrating UTC photodiodes with high- and low-confinement SOAs using quantum well intermixing and MOCVD regrowth," *Electronic Letters*, vol. 42, No. 16, Aug. 3, 2006.
(Continued)

*Primary Examiner* — Ellen Kim
(74) *Attorney, Agent, or Firm* — Harness, Dickey & Pierce

(57) ABSTRACT

A monolithic integrated structure comprising a buried heterostructure semiconductor optical amplifier and a deep ridge optical receiver comprising such structure are disclosed.

15 Claims, 5 Drawing Sheets

(51) Int. Cl.
*H01S 5/026* (2006.01)
*H01S 5/10* (2006.01)
*H01S 5/227* (2006.01)
*H01S 5/50* (2006.01)

(52) U.S. Cl.
CPC ............ *H01S 5/026* (2013.01); *H01S 5/0262* (2013.01); *G02B 2006/12121* (2013.01); *G02B 2006/12147* (2013.01); *G02B 2006/12195* (2013.01); *H01S 5/1014* (2013.01); *H01S 5/1032* (2013.01); *H01S 5/2275* (2013.01); *H01S 5/50* (2013.01)
USPC .................................. 385/30; 385/39; 385/50

(56) References Cited

U.S. PATENT DOCUMENTS

| | | | |
|---|---|---|---|
| 7,583,869 B2 | 9/2009 | Kang et al. | |
| 8,125,707 B2* | 2/2012 | Kim et al. | 359/344 |
| 2005/0041280 A1 | 2/2005 | Lee et al. | |
| 2005/0084991 A1 | 4/2005 | Lee et al. | |
| 2007/0092192 A1 | 4/2007 | Achouche et al. | |
| 2007/0110357 A1 | 5/2007 | Forrest et al. | |
| 2007/0171515 A1* | 7/2007 | Kang et al. | 359/333 |
| 2010/0111468 A1* | 5/2010 | Funabashi et al. | 385/14 |

FOREIGN PATENT DOCUMENTS

| | | |
|---|---|---|
| JP | 2003533896 A | 11/2003 |
| JP | 2007158351 A | 6/2007 |
| WO | WO-03102659 A2 | 12/2003 |
| WO | WO-03102678 A1 | 12/2003 |

OTHER PUBLICATIONS

Fengnian Xia et al., "Monolithic Integration of a Semiconductor Optical Amplifier and a High Bandwidth p-i-n Photodiode Using Asymmetric Twin-Waveguide Technology," IEEE Photonics Technology Letters, vol. 15, No. 3, Mar. 2003.
Written Opinion and Search Report for corresponding Singapore Application No. 201302222-3 dated Oct. 4, 2013.
Mason, et al., "Photonic integrated receiver for 40 Gbit/s transmission", Electronics Letters, IEE Stevenage, GB, vol. 38, No. 20, Sep. 26, 2002, pp. 1196-1197.
Su Hwon Ho, et al., "Fabrication of transmit-receive devices monolithically integrated with semiconductor optical amplifier", Japanese Journal of Applied Physics, Part 1, vol. 47, No. 5, May 16, 2008, pp. 3489-3492.
International Search Report for PCT/ISA/210, Aug. 11, 2011.
Decision of Rejection for corresponding Japanese Application No. 2013-530701 dated Oct. 28, 2014 and English translation thereof.
Notice of Preliminary Rejection for corresponding Korean Application No. 2013-7011120 dated Dec. 9. 2014 and English translation thereof.

* cited by examiner

MONOLITHIC INTEGRATED STRUCTURE COMPRISING A BURIED HETEROSTRUCTURE SEMICONDUCTOR OPTICAL AMPLIFIER AND A PHOTODETECTOR

CROSS REFERENCE TO RELATED APPLICATIONS

This application claims the benefit of European patent application No. 10306064.6, filed Sep. 30, 2010 and claims the benefit of International patent application No. PCT/EP2011/066766, filed Sep. 27, 2011, the respective contents of which are hereby incorporated by reference in their entirety.

FIELD OF THE INVENTION

The present invention relates to optical components.

BACKGROUND ART

Optical pre-amplification is widely used for example to increase photoreceivers sensitivity in order to improve the distance for data transmission over optical fiber in digital communication systems. In such systems cost is typically an important issue to be considered. In this regard, monolithic integration of a semiconductor optical amplifier (hereinafter also referred to as SOA) and a photodetector in one InP single chip become particularly important as it may contribute to reducing cost of the receiver terminal as well as its size.

SUMMARY

Before describing the embodiments of the invention, a brief introduction of known solutions is provided.

Three solutions are known to be used for monolithic integration of SOAs and photodetectors:

A first solution uses a shallow ridge SOA integrated with a deep ridge photodiode (PD) coupled vertically by lateral taper that allows for a fabrication process with a single step growth of the vertical epitaxial structures of SOA and PD, respectively. However, in such known solution, the coupling between the SOA and the photodiode typically induces propagation losses which typically causes a limitation in the amplification gain (typically less than 10 dB). In addition, a low confinement SOA active region is typically required for vertical coupling which typically induces very large TE/TM polarization loss.

A second known solution relates to employing a similar active region and semi-insulating buried heterostructure for both the SOA and the photodetector (also known as butt-coupling) to increase coupling efficiency between the two optical components. Based on this know solution a larger gain, of about 14 dB, has been demonstrated. However, one typical yet important limitation of this known solution is associated to a reduced power saturation of the photodiode due to direct optical injection which typically induces a photodiode bandwidth roll-off about 3-dB. A further drawback is the difficulty (or in occasions impossibility) to optimize independently the thickness of the active region of the SOA and the photodiode, typically leading to poor SOA performances and/or bandwidth limitation of the photodiode.

A third known solution relates to the use of Quantum Well Intermixing to typically use the same waveguide for the SOA section and the passive section and a photodiode evanescently coupled on top of the passive waveguide. In such solution, the SOA, the passive waveguide and the photodiode typically use the same shallow ridge structure. Although this solution typically allows for evanescent coupling to increase the power saturation of the photodetector and that the common shallow ridge structure simplifies the process of the component, it typically has the drawback of providing such increase of power saturation at the expense of a low coupling efficiency at the SOA input (fiber coupling section) which typically increases the SOA noise figure and therefore typically reduces the sensitivity of the receiver. Spot size converters (SSC) may be a remedy for such coupling problem, however SSCs are typically difficult to achieve with ridge SOA structure because of the high confinement in the active region. A further typical drawback of the shallow ridge structure is the increase of the capacity and the resistance of the photodiode, typically leading to an estimated bandwidth lower than 36 GHz despite a small size (about 90 $\mu m^2$) and a 25Ω effective load. In addition, to the knowledge of the inventors, with this solution only TE mode operating devices have been demonstrated so far.

Accordingly some embodiments of the invention feature a monolithic integrated structure comprising a buried heterostructure semiconductor optical amplifier comprising an active waveguide and a deep ridge photodetector.

According to some specific embodiments, the structure comprises a first low confinement optical passive waveguide configured to inject an incoming light into the structure.

According to some specific embodiments, the structure comprises a first spot size converter configured to allow coupling between the first optical passive waveguide and an active waveguide of the semiconductor optical amplifier.

According to some specific embodiments, the structure comprises an optical passive transition waveguide having a high confinement and configured to evanescently couple the light to an active region of the photodiode.

According to some specific embodiments, the high transition optical passive waveguide comprises an InGaAsP layer.

According to some specific embodiments, the active waveguide of the semiconductor optical amplifier and the transition optical passive waveguide are butt-coupled.

According to some specific embodiments, the active waveguide of the semiconductor optical amplifier is coupled by means of a second spot size converter to a second optical passive waveguide and the second optical passive waveguide is coupled by means of a third spot size converter to the passive transition waveguide thereby preventing or substantially reducing backward reflection toward the semiconductor optical amplifier.

According to some specific embodiment, the passive transition waveguide is planar, at least in part, in the vicinity of the photodetector.

Some embodiments of the invention feature a receiver comprising the monolithic integrated structure as proposed herein.

These and further features and advantages of the present invention are described in more detail, for the purpose of illustration and not limitation, in the following description as well as in the claims with the aid of the accompanying drawings.

DETAILED DESCRIPTION

Embodiments of the invention relate to the use of a buried heterostructure SOA monolithically integrated with a photodiode.

A buried heterostructure (BH) configuration is known in the related art. In brief, such configuration comprises various layers or regions of semiconductor material with different crystalline structures which in turn gives rise to different band-gaps within the structure.

A buried heterostructure is preferred to be used in an SOA because it may allow a better thermal dissipation and lower optical losses than shallow ridge and deep ridge structures. Furthermore, it may become comparatively easier to obtain low polarization dependence together with low coupling loss with optical fiber when use is made of a buried heterostructure rather than of shallow ridge and deep ridge structures.

Some preferred materials to be used for making a BH-SOA are InGaAsP and InGaAs.

The photodiode structure is provided in deep ridge configuration which is compatible with high speed operation (low junction capacitance and low resistance).

Some preferred materials to be used for making a Photodetector are InGaAsP, InGaAs and InP.

In order to ensure high coupling efficiency and electrical isolation between the SOA and the photodetector a high confinement passive transition optical waveguide may be inserted between the SOA output passive optical waveguide and the photodetector.

In the context of the present description, reference to "high" confinement waveguide is to be understood to relate to an optical waveguide which is capable of carrying an optical mode with an area typically having a width at $1/e^2$ of about 1.5 µm or less and a high optical confinement in the waveguide layer (for example about 60%). Similarly, a low confinement optical waveguide is a waveguide which is capable of carrying an optical mode with an area typically having a width at $1/e^2$ between about 1.5 µm and 6 µm and a low optical confinement in the waveguide layer (for example about 15%). By way of illustrative and non-limiting example it is to be noted that a low confinement waveguide may be made in InGaAsP material (photoluminescence of about 1.17 µm) having a thickness of about 0.15 µm and a width of about 3 µm; similarly, a high confinement waveguide may be made in InGaAsP material (photoluminescence of about 1.3 µm) having a of thickness of about 0.52 µm and a width of about 0.13 to 3 µm and about 1.1 µm in butt coupled configuration.

Such passive waveguide may provide electrical isolation and the high confinement characteristic of the waveguide may greatly improve coupling efficiency and reduce reflection in the BH structure and the planar section area. This solution has also the advantage of reducing reflection between the BH structure and the planar section where the photodetector is provided as will be described in further detail below.

A preferred material to be used for making a passive transition waveguide is InGaAsP.

Figure 1:
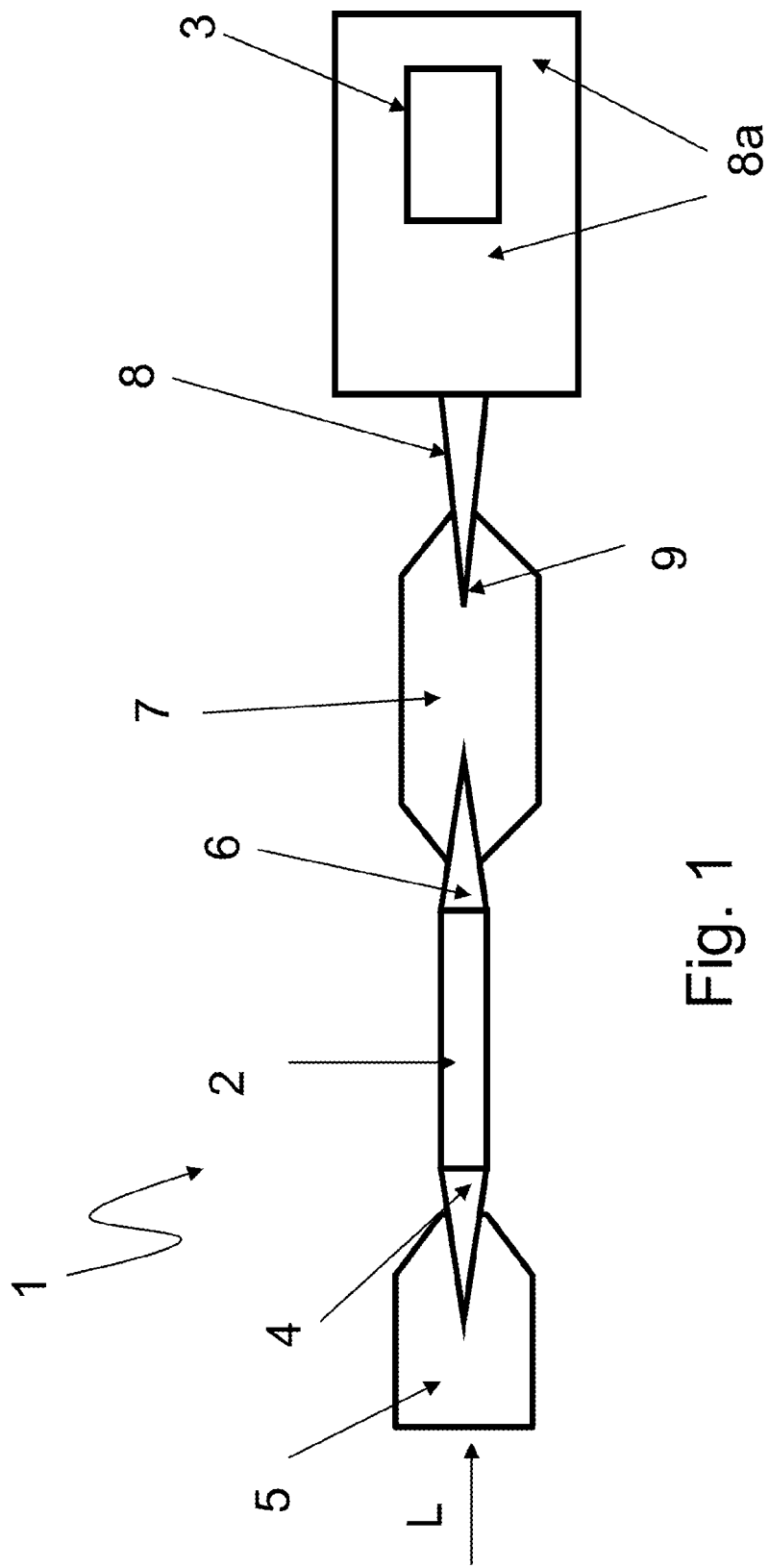
FIG. 1 is an exemplary schematic representation of a top view of a monolithically integrated buried heterostructure SOA and a deep ridge photodetector according to some embodiments.

FIG. 1 is an exemplary schematic representation of a top view of a device 1 comprising a BH-SOA 2 and photodetector 3 monolithically integrated according to some embodiments. The device 1 is configured to receive input light L through a first spot size converter (SSC) 4 in order to allow efficient and low loss coupling of light between an incoming optical fiber (not shown in the figure) and the BH-SOA 2. A first low confinement optical passive waveguide 5 is preferably used in order to inject the incoming light into the SSC 4.

Some preferred materials to be used for making a SSC are InGaAsP and InGaAs.

The SSC 4 thus couples the incoming light into the BH-SOA 2 where it is amplified and is subsequently provided from an active waveguide of the BH-SOA 2 to an output of BH-SOA where it is input in a second SSC 6. The second SSC 6 also allows for an efficient and low loss coupling of the light to the next stage of the device 1 which may be a second optical passive waveguide 7. The second SSC 6 may have the same structure and be made of the same materials as the first SSC 4. Furthermore the first optical passive waveguide 5 and the second optical passive waveguide 7 may be parts of one and the same structure as shown in FIG. 2.

The light may then be input from the optical passive SOA waveguide 7 into an optical passive transition waveguide 8 preferably made of InGaAsP layer (with the photoluminescence Q of the material being about 1.3 µm). The optical passive transition waveguide 8 may be used to evanescently couple the light to an active region of the photodiode 3.

Evanescent coupling within the context of the present invention may be produced when an absorbing layer is not in front of the incoming light but displaces, for example on the top of the waveguide which guides the light. As a result the absorption of light is distributed throughout a wider area of absorption, thus the light is evanescently absorbed by the photodiode. This effect may avoid or reduce undesired concentration of photo-generated carriers.

Figure 2:
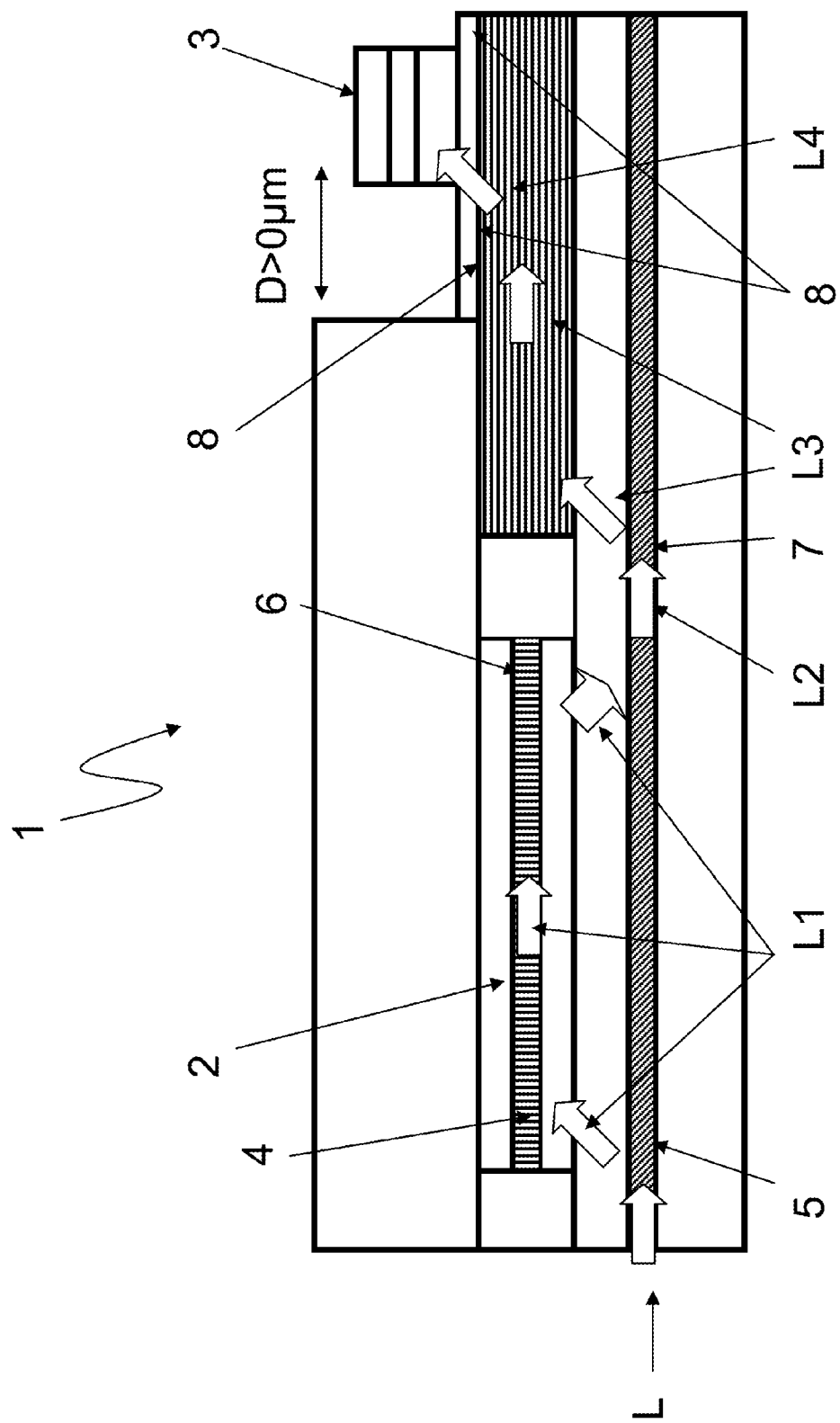
FIG. 2 is an exemplary schematic representation of a cross-sectional view of the monolithically integrated buried heterostructure SOA and photodetector of FIG. 1.

FIG. 2 is an exemplary schematic representation of a cross-sectional view of the device of FIG. 1. In this figure like elements have been given like reference numerals as those of FIG. 1 unless otherwise provided.

As shown in FIG. 2, the device 1 comprises a BH-SOA 2 and photodetector 3 monolithically integrated according to some embodiments. The photodetector is preferably deep ridge.

An incoming input light L is preferably input in the optical passive SOA waveguide 5 which is used in order to inject the incoming light L into the first SSC 4. The first SSC 4 couples the light to the BH-SOA 2.

As already mentioned above the BH-SOA 2 amplifies the received light and subsequently provides the light at an output thereof where it is input in a second SSC 6. The light travelling in, through and out of the BH-SOA has been shown in FIG. 2 by reference numeral L1. The second SSC 6 allows for an efficient and low loss coupling of the light, shown as L2, to the second optical passive SOA waveguide 7. The light may then be input from the optical passive SOA waveguide 7 into an optical passive transition waveguide 8 as shown by means of arrows L3. The optical passive transition waveguide 8 may be used to evanescently couple the light, shown as L4, to an active region of the photodiode 3.

As shown more clearly in FIG. 1, the active waveguide of the semiconductor optical amplifier 21 is coupled by means of the second spot size converter 6 to the second optical passive waveguide 7 and the second optical passive waveguide is coupled by means of a third spot size converter 9 to the passive transition waveguide 8. This arrangement has the advantage of preventing or substantially reducing backward reflection from the passive transition waveguide 8 toward the semiconductor optical amplifier 2.

Preferably, the passive transition waveguide 8 has a planar shape in the vicinity of the photodetector area. This area is schematically shown in FIGS. 1 and 2 by reference numeral 8a. The planar shape of the passive transition waveguide is advantageous because it simplifies manufacturing processes.

Figure 3:
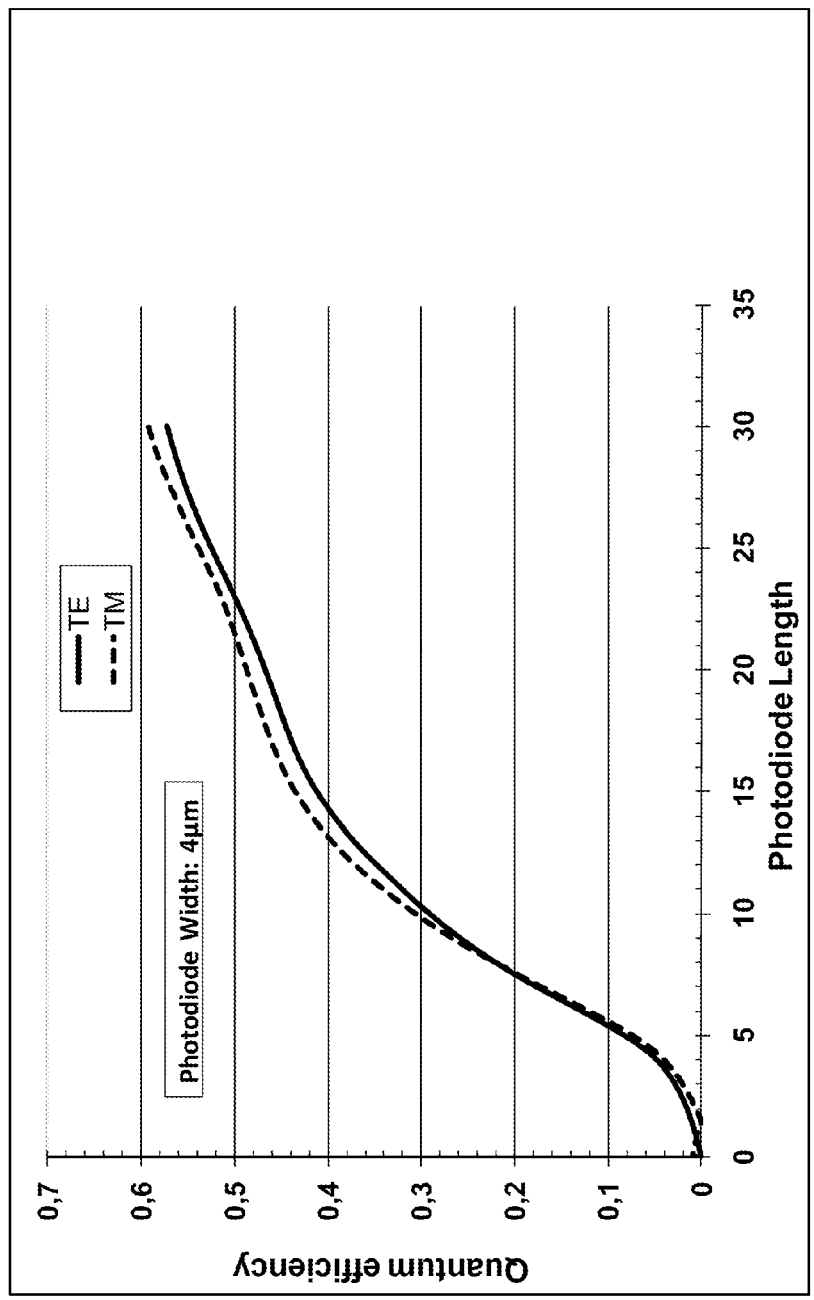
FIG. 3 is an exemplary graphical illustration of a simulation result related to a coupling efficiency between a and an SOA wherein photodiode quantum efficiency is shown versus diode length for a specific diode width and for a specific BH-SOA photodiode optical transition waveguide length.

FIG. 3 is an exemplary graphical illustration of a simulation result related to coupling efficiency between the low confinement passive waveguide and the photodetector (in this case a photodiode) showing a photodiode quantum efficiency versus diode length for a specific diode width and for a specific BH-SOA photodiode optical transition waveguide length. It is to be noted that this graph is provided merely for the purpose of illustration and better understanding of the embodiments described here. Thus, although this figure shows simulation results it is not to be construed as imposing any limitation on such embodiments. The graph of FIG. 3 relates to a photodiode width of about 4 μm and for a BH-SOA photodiode optical transition waveguide 8 length (namely from the output of the BH-SOA to the input of the photodiode) with a value greater than zero (>0). Said length is represented in FIG. 2 by reference D for which some preferred values are about 0.1 μm and about 10 μm. For a photodiode of 4×15 μm² (which may be a typical diode area used for 100 Gb/s applications) a quantum efficiency of about 42% is achieved—which is considered to be high—at a wavelength of about 1.55 μm with TE/TM polarization dependence loss of less than about 0.5 dB. When using SOA optical pre-amplification, a high gain (for example above 20 dB) is expected allowing high sensitivity.

The above embodiments are provided for a device structure in which the BH-SOA and the photodetector are provided with certain separation between each other. According to alternative embodiments the BH-SOA and PD may be located on approximately or substantially next with respect to each other. This configuration may also be called a butt-coupled configuration.

Figure 4:
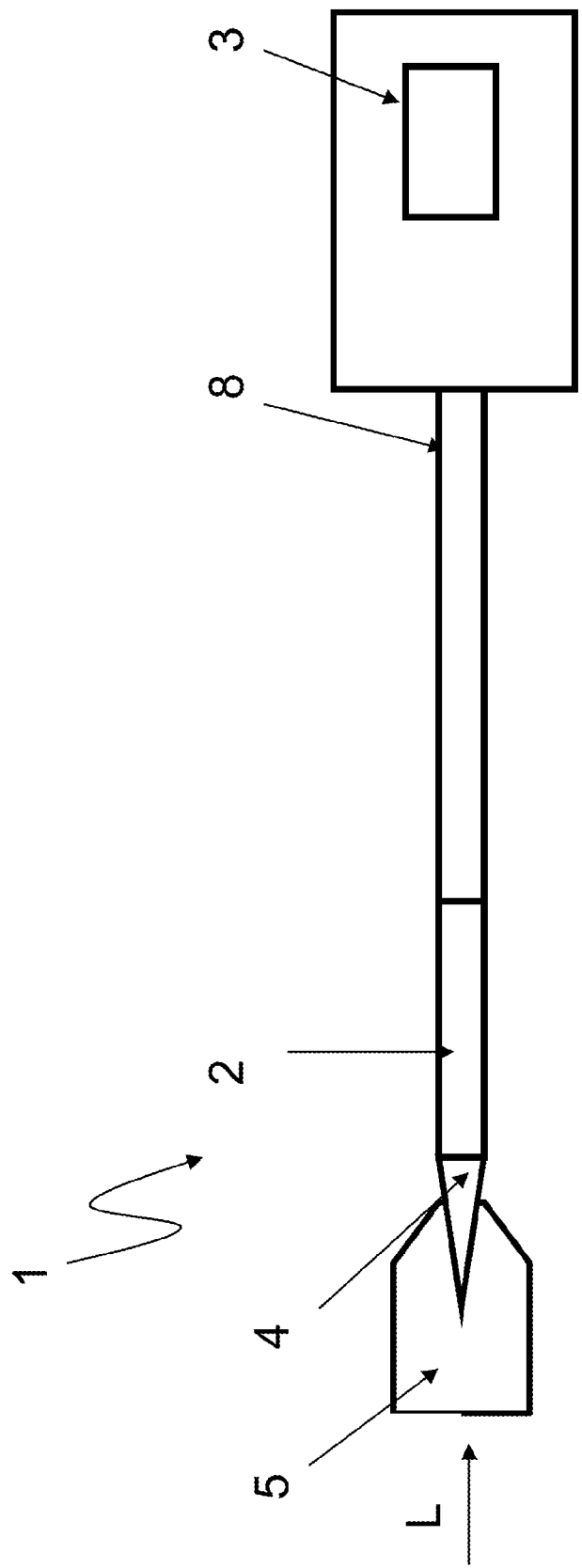
FIG. 4 is an exemplary schematic representation of a top view of a monolithically integrated BH-SOA and a deep ridge photodetector in but-coupled configuration according to some embodiments.

FIG. 4 is an exemplary top view of such a BH-SOA 2 and a deep ridge photodiode 3 monolithically integrated in butt-coupled configuration according to some embodiments. In this figure, like elements have been given like reference numbers as those of FIGS. 1 and 2.

Butt-coupling is a known technique which presents certain advantages for a number of applications, in particular in case where it is desired to design a device capable of integrating a variety of functionalities, for example multiplexing/demultiplexing in addition to photo-detection.

Referring back to FIG. 4, the device 1 is configured to receive the input light L through a first spot size converter (SSC) 4 in order to allow efficient and low loss coupling of light between on incoming optical fiber (not shown on the figure) and the BH-SOA 2. An optical passive waveguide 5 is preferably used in order to inject the light into a spot size converter (SSC) 4.

The SSC 4 thus couples the incoming light into the BH-SOA 2 where it is amplified and is subsequently provided at an output of the BH-SOA 2 where it is input in the passive transition waveguide 8 preferably made of InGaAsP. The optical passive transition waveguide 8 may be used to evanescently couple the light to an active region of the photodiode, as already described in relation to FIGS. 1 and 2.

Figure 5:
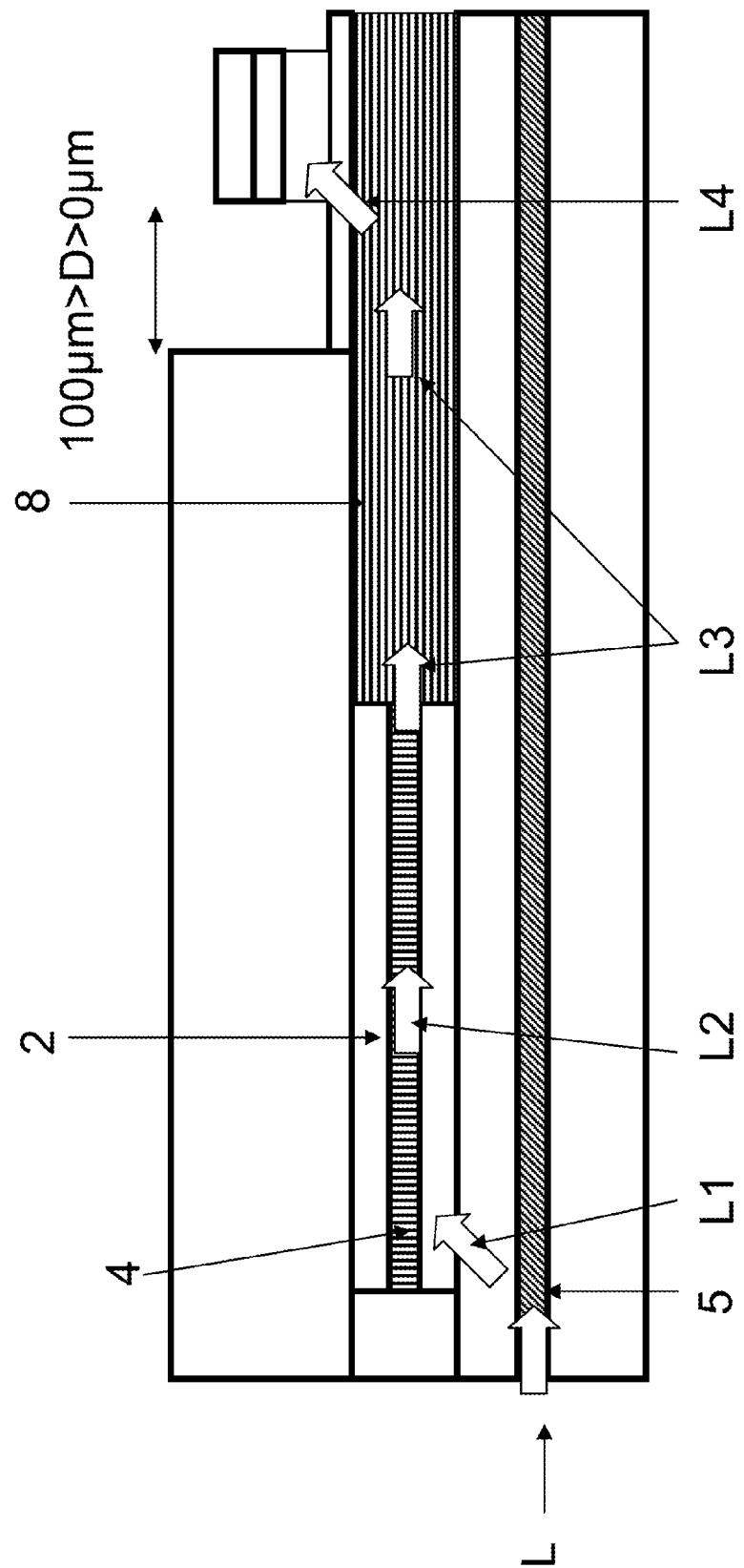
FIG. 5 is an exemplary schematic representation of a cross-sectional view of the monolithically integrated buried heterostructure SOA and photodetector of FIG. 4.

FIG. 5 is an exemplary schematic representation of a cross-sectional view of the device of FIG. 4.

As shown in FIG. 5, the device comprises a BH-SOA 2 and a deep ridge photodiode 3 monolithically integrated according to some embodiments.

An incoming input light L is preferably input in the optical passive waveguide 5 which is used in order to inject the incoming light L into the first SSC 4 as shown by arrow L1. The first SSC 4 couples the light into the BH-SOA 2.

As already mentioned above, the BH-SOA 2 amplifies the received light and subsequently provides the light at an output thereof where it is input in the passive transition waveguide 8. The light travelling in and through the BH-SOA has been shown in FIG. 5 by reference numeral L2 and the light travelling in the passive transition waveguide has been shown as L3. The optical passive transition waveguide 8 may be used to evanescently couple the light, shown as L4, to an active region of the photodiode 3.

In the butt-coupled configuration of FIGS. 4 and 5, the length D of the optical transition waveguide 8 (namely from the output of the BH-SOA to the input of the photodiode) may also have any value greater than zero (>0) from which some preferred values are below about 100 μm, or about 10 μm.

The solution proposed herein is related to providing optical pre-amplification which is an important feature for receivers developed for high speed applications (100 Gb/s and beyond) with extended transmission reach. The integration of an optimized structure of a photodetector (deep ridge compatible for high speed operation) with a buried heterostructure SOA (providing high optical gain, low noise factor and low polarization dependence) preferably taking advantage of an evanescent optical coupling via SSCs and a buried waveguide provides such desired functionalities. Such integration scheme is different from the known solutions and may solve the limitation of optical reflection between said two components, which may allow to etch the re-growth interface between the SOA active waveguide and the high confinement passive waveguide which otherwise may cause reflections if the two waveguide are not substantially or perfectly aligned.

Thus the solution proposed herein provides the advantage of allowing the achievement of high optical gain, low insertion loss and low noise figure. Furthermore, the proposed solution may provide low TE/TM polarization loss and high speed operation as compared to known solutions.

Further it is to be noted that the list of structures corresponding to the claimed means is not exhaustive and that one skilled in the art understands that equivalent structures can be substituted for the recited structure without departing from the scope of the invention.

It should be appreciated by those skilled in the art that any block diagrams herein represent conceptual views of illustrative circuitry embodying the principles of the invention.

The invention claimed is:

1. A monolithic integrated structure comprising a buried heterostructure semiconductor optical amplifier comprising an active waveguide, a deep ridge photodetector and a first optical passive waveguide configured to inject an incoming light into the structure; the structure comprising a first spot size converter configured to couple the active waveguide to a second optical passive waveguide, and a second spot size converter configured to couple the second optical passive waveguide to an optical passive transition waveguide configured to evanescently couple the light to an active region of the photodiode.

2. The structure of claim 1 comprising a third spot size converter configured to allow coupling between the first optical passive waveguide and the active waveguide of the semiconductor optical amplifier.

3. The structure of claim 1 wherein the optical passive transition waveguide comprises an InGaAsP layer.

4. The structure of claim 1 wherein the active waveguide of the semiconductor optical amplifier and the optical passive transition waveguide are butt-coupled.

5. The structure of claim 1 wherein the passive transition waveguide is planar, at least in part, in the vicinity of the photodetector.

6. A receiver comprising a monolithic integrated structure comprising a buried heterostructure semiconductor optical amplifier comprising an active waveguide, a deep ridge photodetector and a first optical passive configured to inject an incoming light into the structure; the structure comprising a first spot size converter configured to couple the active waveguide to a second optical passive waveguide, and a second spot size converter configured to couple the second optical passive waveguide to an optical passive transition waveguide configured to evanescently couple the light to an active region of the photodiode.

7. The receiver of claim 6 comprising a third spot size converter configured to allow coupling between the first optical passive waveguide and the active waveguide of the semiconductor optical amplifier.

8. The receiver of claim 6 wherein the optical passive transition waveguide comprises an InGaAsP layer.

9. The receiver of claim 6 wherein the active waveguide of the semiconductor optical amplifier and the optical passive transition waveguide are butt-coupled.

10. The receiver of claim 6 wherein the passive transition waveguide is planar, at least in part, in the vicinity of the photodetector.

11. The structure of claim 1, wherein the first and second optical passive waveguides are different portions of a same layer in the structure.

12. The receiver of claim 6, wherein the first and second optical passive waveguides are different portions of a same layer in the structure.

13. A monolithic integrated structure comprising a buried heterostructure semiconductor optical amplifier forming an optical path from a first optical passive waveguide to an active waveguide, from the active waveguide to a second optical passive waveguide positioned at a layer lower than the active waveguide, from the second optical passive waveguide to an optical passive transition waveguide, and from the optical passive transition waveguide to a deep ridge photodetector, and at least one spot size converter disposed between the first optical passive waveguide and the optical passive transition waveguide configured to evanescently couple the light to an active region of the photodiode.

14. The structure of claim 12, wherein the first and second optical passive waveguides are different portions of a same layer in the structure.

15. The structure of claim 12, wherein the active waveguide of the semiconductor optical amplifier is coupled by means of a first spot size converter to the second optical passive waveguide and the second optical passive waveguide is coupled by means of a second spot size converter to the passive transition waveguide.

* * * * *